United States Patent [19]

Thornton

[11] Patent Number: 4,870,652

[45] Date of Patent: Sep. 26, 1989

[54] MONOLITHIC HIGH DENSITY ARRAYS OF INDEPENDENTLY ADDRESSABLE SEMICONDUCTOR LASER SOURCES

[75] Inventor: Robert L. Thornton, East Palo Alto, Calif.

[73] Assignee: Xerox Corporation, Stamford, Conn.

[21] Appl. No.: 216,929

[22] Filed: Jul. 8, 1988

[51] Int. Cl.$^4$ .............................................. H01S 3/19
[52] U.S. Cl. ........................................ 372/50; 372/46; 372/45
[58] Field of Search ................. 372/50, 45, 46, 44, 372/43, 97

[56] References Cited

U.S. PATENT DOCUMENTS

| | | | |
|---|---|---|---|
| 4,378,255 | 3/1983 | Holonynak et al. | 372/45 |
| 4,445,125 | 4/1984 | Scifres et al. | 346/108 |
| 4,474,422 | 10/1984 | Kitamura et al. | 350/6.8 |
| 4,706,255 | 11/1987 | Thornton et al. | 372/50 |
| 4,727,557 | 2/1988 | Burnham et al. | 372/46 |
| 4,731,789 | 3/1988 | Thornton | 372/46 |

OTHER PUBLICATIONS

Y. Tokuda et al., "Dual Wavelength Emission From a Twin Stripe Single Quantum Well Laser", Applied Physics Letters, vol. 51(21), pp. 1664–1666, Nov. 23, 1987.

Primary Examiner—William L. Sikes
Assistant Examiner—Georgia Y. Epps
Attorney, Agent, or Firm—W. Douglas Carothers, Jr.

[57] ABSTRACT

Monolithic high density arrays of independently addressable semiconductor laser emitters or elements are able to be placed in close center-to-center proximity, e.g., on 3–10 μm centers, without experiencing any undesirable phase locking and with minimal amount of electrical and thermal interaction or crosstalk occurring between the independently addressed lasing elements and their independent operation. Such design features are highly suitable for high speed raster output scanner (ROS) and laser printing applications.

4 Claims, 7 Drawing Sheets

MONOLITHIC HIGH DENSITY ARRAYS OF INDEPENDENTLY ADDRESSABLE SEMICONDUCTOR LASER SOURCES

BACKGROUND OF THE INVENTION

This invention relates to semiconductor lasers fabricated after device growth utilizing impurity induced disordering (IID) and more particularly the fabrication and design of multi-emitter semiconductor laser arrays having minimal electrical and thermal crosstalk and high efficiency useful for high speed raster output scanners (ROS) and laser printing applications.

The ability to fabricate closely spaced independently addressable laser sources is important for many applications such as optical disk technology, laser printing, optical interconnection and fiber optic communications. It is often desirable to have the laser elements of a laser array in as close proximity as possible in order to simplify optical system design. For optical interconnections, and especially when spacing between laser elements is only a few microns, it is highly desirable to mount the devices with their p-side up in order to simplify the separation of electrical connection to the laser devices. However, this places constraints on device performance in order to achieve CW operation. Previous attempts have been made to provide separate contacting of laser elements of such devices but these devices were not capable of CW operation. In addition, the optical and carrier confinement was insufficient to prevent coupling and phase locking between sources.

Acceptable CW performance has been obtained in p-side up configuration with etch and regrown buried heterostructure lasers, but reliability and yield remain key issues in production of high density laser arrays by this technique.

Single emitter lasers generally of the III-V material regime, e.g., GaAs/GaAlAs, have a designed higher refractive index cavity which is formed between laterally adjacent regions of comparatively lower refractive index. It is known to produce such optical cavities by means of nonplanar growth mechanisms, such as a channel or mesa in the laser substrate or by means of impurity induced disordering (IID) as exemplified in Holonyak U.S. Pat. No. 4,378,255. As taught in this patent, a semiconductor structure containing a quantum well feature, such as a multiple quantum well, undergoes compositional disordering due to impurity diffusion. Diffusion of an impurity into spatially separated regions of the quantum well feature will cause an intermixing of Al and Ga in the well feature so that the average refractive index through the region of these layers subjected to disordering by diffusion will have a lower index of refraction compared to undisordered regions including the central region between the designated spatially separated regions. Thus, the central region may be utilized as an optical waveguide cavity for lasing and/or light propagation.

It has been shown that silicon impurity induced disordering (Si-IID) technology is capable of producing low threshold buried heterostructure lasers with power conversion efficiencies on the order of 50% at normal power levels. This high level of performance permits these types of devices to be mounted p-side up and CW operated. In addition, it has been shown that laser arrays of this type with center-to-center separations as low as 4 $\mu$m with a single contact addressing electrode exhibit a high degree of uniformity and do not exhibit phase locked operation as a result of the strong refractive index waveguiding mechanism provided via Si-IID. Therefore, this technology should also be considered for high density laser arrays wherein each of the laser elements are independent addressable if the problems of optical and electrical crosstalk, such as modulation or oscillation crosstalk, between independently operated laser elements in the array does not present serious problems for a particular application or such problems can be suppressed to an acceptable level.

The use of laser of LED arrays for laser printers having flying spot scanners or raster output scanners (ROS) have been suggested previously, as exemplified in U.S. Pat. Nos. 4,445,125; 4,474,422 and patent application Ser. No. (D/86364), assigned to the same assignee as herein, because of their small size, low power requirements, longevity, ease of fabrication, low cost and sensitivity in the infrared spectra for exposure of infrared photoreceptors to create or write a latent electrostatic image on the charged photoreceptor surface. There is also the advantage of scanning simultaneously more than one scan line at a time with two or more beams from a monolithic semiconductor laser source, as exemplified in U.S. Pat. No. 4,474,422 and in patent application Ser. No. (D/86364).

It is a principal object of this invention to use IID in providing high density arrays of independently addressable semiconductor laser sources, particularly useful in ROS and laser printing applications and also applicable in other applications, such as optical recording playback systems.

SUMMARY OF THE INVENTION

According to this invention, monolithic high density arrays of independently addressable semiconductor laser sources or elements are able to be placed in closer center-to-center proximity than has been previously possible and known in the art without experiencing any phase locking and with minimal amount of electrical and thermal interaction or crosstalk occurring between the independently addressed lasing elements and without interfering with their independent operation.

The independently addressable semiconductor laser array of this invention comprises a plurality of semiconductor layers with at least two lasing elements disposed in spatially separated optical cavities, the layers including an active region for light wave generation and propagation under lasing conditions. Impurity induced disordering (IID) is performed into regions through the active region to produce disordered alloy regions laterally adjacent to and between spatially separated and designated optical cavities. The depth of these disordered regions is sufficient to optically isolate the lasing elements so as not to function in phase locked condition. Further, a barrier is formed between the lasing elements and is extended into the array a sufficient distance to electrically isolate the individual lasing elements. The combination of the disordered alloy regions and the barriers provides for close proximity of the lasing elements with minimal electrical and thermal crosstalk relative to the independent operation of the individual lasing elements. The center to center spacing of the lasing elements can be in the range of 3-10 $\mu$m without objectionable electrical, optical or thermal crosstalk. The cross connection resistance between the lasing elements may be, for example, on the order of 15 M$\Omega$. Means are provided to reduce the extent of the parasitic junction in the lasing elements with the depth thereof limited to the depth of the electrically isolated barrier. In the case of laser arrays containing more than two closely spaced laser elements, unique design features in the pumping contacts to each laser element must be incorporated so as not to interfere with the independent addressing of each laser element.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
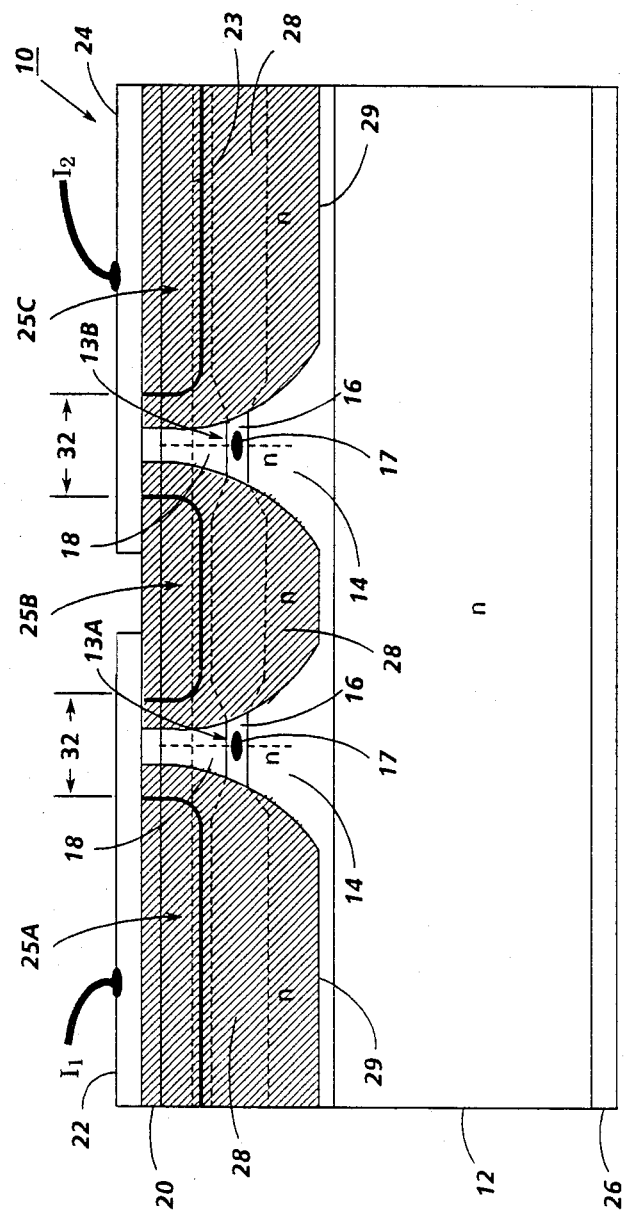
FIG. 1 schematically illustrates a side elevation of a first embodiment of a semiconductor laser array of this invention comprising two lasing elements.

Reference is now made to FIG. 1 wherein there is illustrated a first embodiment of a monolithic high density array 10 of independently addressable semiconductor laser sources comprising this invention. Array 10 comprises a substrate 12 of n-GaAs upon which is epitaxially deposited a cladding layer 14 of n-$Ga_{1-x}Al_xAs$; an active region 16 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where x, $y'>y$ or a separate single or multiple quantum well structure in a separate confinement cavity; a cladding layer 18 of p-$Ga_{1-z}Al_zAs$ where $x,z,y'>y$; and cap layer 20 of p+GaAs. The epitaxial deposition may be via MOCVD, which is known in the art.

It is a requirement in the practice of this invention that the multiple emitters of laser array 10, represented by the facet emission points 17, be sufficiently close to one another but not operate in a phase locked condition. This is in order to ensure that the emission of two or more elements comprising the laser array may be independently addressable in spite of their close packed density required for focus to an image plane, such as in the case of a photoreceptor surface of a printer, to form a sufficiently dense array of pixels required for good printing resolution.

As an example of typical layer thicknesses, cladding layer 14 may be in the range of 0.5 to 1.5 μm and active region 16 may be a thin conventional active layer having a thickness, for example, in the range of 50 nm to 300 nm or be comprised of a superlattice structure with quantum wells of GaAs which may be about 3 nm to 50 nm thick and the barrier layers of $Ga_{1-y'}Al_{y'}As$ may be about 1 nm to 15 nm thick with y' in the range of 0.1 to 1.0. Cladding layer 18 may have a thickness in the range of 0.1 to 1.0 μm. Cap layer 20 may be in the range of 0.1 to 1.5 μm. An actual array 10 fabricated comprises an n-GaAs substrate 12 followed by a 0.7 μm thick n-GaAs buffer layer (not shown), a 0.7 μm thick n-$Ga_{0.8}Al_{0.2}As$ buffer layer (not shown), a 1.4 μm thick n-$Ga_{0.6}Al_{0.4}As$ cladding layer 14, a 66 nm thick multiple quantum active region 16 and comprising four GaAs wells sandwiched between three barriers layers of $Ga_{0.6}Al_{0.4}As$ 0.9 μm thick, a 1.4 μm thick p-$Ga_{0.6}Al_{0.4}As$ cladding layer 18 and a 0.1 μm thick cap layer 20 of p-GaAs.

To form a multi-emitter array laser, in this particular embodiment a two beam emitter, impurity induced disordering (IID) techniques are utilized, e.g. diffusion disordering or implant/anneal disordering. It should be noted here that these types of disordering are not limited to species traditionally considered as impurities but also can be extended to include any species that either disorders the crystal through diffusion or damages the crystal, through implantation with subsequent high temperature annealing of the damaged crystal creating the desired disordered crystal.

To form a multi-emitter laser array 10, a $Si_3N_4$ mask is formed on the top regions of layer 20 with openings exposing regions of the laser structure to IID techniques. Optical cavities and current confinement are established for lasing elements 13A and 13B by selectively diffusing a high concentration n-type impurity into regions of the laser structure exposed by the masking operation. For example, silicon may be selectively diffused at a temperature above 800° C. for a sufficient period of time in a semi-sealed graphite boat containing appropriate diffusion sources. This type of process would be typically carried out in a hydrogen flow. The diffusion of silicon into the quantum well active region 16 causes an intermixing of Al and Ga in the GaAs—GaAlAs in the active region resulting in a GaAlAs alloy of averaged AlAs mole fraction illustrated as IID regions 28 in FIG. 1. In the case of a thin active layer of GaAs, or single quantum well layer of GaAs or $Ga_{1-y}Al_yAs$, the intermixing is between Ga in the active layer and Al in the adjacent cladding layer 18 of $Ga_{1-z}Al_zAs$. In the case of a multiple quantum well structure, the intermixing of Al and Ga is principally between the well and barrier layers but also extends to one or more of the alloy cladding layers 14 and 18. The diffusion of silicon is accomplished at a temperature, such as, 850° C. and is maintained for a sufficiently long period of time, e.g. several hours, to penetrate active region 16, as indicated at points 29. In the example above, the depth of the disordered regions 28 are about 1.5 μm and about 8 μm wide. Lasing elements or sources 13 may be separated at about 10 μm center-to-center and active region 16A may be about 2 μm wide. The forgoing processing is disclosed in patent application Ser. No. 07/117,593, filed Nov. 5, 1987, entitled "METHOD OF INTRODUCING IMPURITY SPECIES INTO A SEMICONDUCTOR STRUCTURE FROM A DEPOSITED SOURCE AND APPLICATION THEREOF", which assigned to the same assignee as herein and is incorporated herein by reference thereto.

Following the formation of regions 28, a p-type zinc diffusion 21 is performed across the entire surface of the structure to a depth indicated at 23. This provides for good ohmic contact and reduces the series resistance through lasing elements 13. Electrically insulating barriers are then selectively performed, as shown in FIG. 1 at 25A, 25B and 25C. These barriers 25 may be created, for example, by a proton bombardment to a depth beyond that of zinc diffusion 21 forming the current pumping channel 32, which may be about 4 or 5 μm wide. Bombardment 25B between lasing elements 13 is an important feature to provide a level of electrical isolation between these sources or emitters sufficient to permit independent operation without electrical or thermal crosstalk. The depth of barriers 25 may be, for example, 0.3 to 0.5 μm relative to the example given here.

Standard photolithographic liftoff techniques are employed to pattern Cr—Au metallization forming separate pumping contacts 22 and 24 for separate pumping of lasing elements 13A and 13B. Contacting is completed with the deposit of metal contact 26 on the bottom surface of substrate 12.

Figure 2:
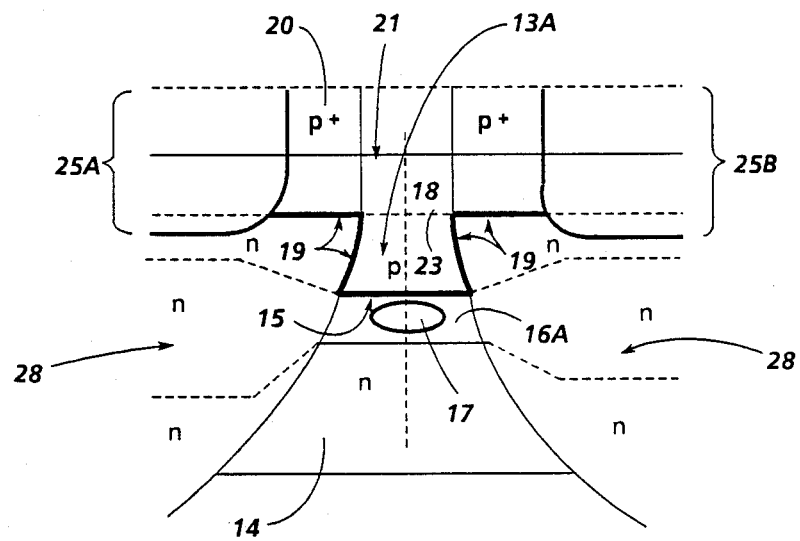
FIG. 2 is an enlarged view of one of the lasing elements shown in FIG. 1.

The array of silicon diffused regions 28 serve the function of at least partially disordering the quantum well structure in active region 16. The resulting laser structure in the plane of active region 16 is such that higher index guiding regions remain in the nondisordered areas of active region 16. The regions of lasing elements 13 provide for enhanced waveguiding due to a higher refractive index compared to adjacent disordered regions 28 of active region 16. Further, referring to FIG. 2, IID $n^{30}$ regions 28 provide a p-n junction 19 at the boundary of high aluminum cladding layer 14, which junction has a higher turn on voltage compared to p-n junction 15 in the vicinity of active regions 16. Since the bandgap of the material at junctions 19 is significantly higher than at the active region junctions, junctions 19 conduct significantly less current at a given junction voltage than lasing junctions 15. Therefore, the leakage current through the high aluminum junction 19 is only a very small fraction of the total current through lasing element and does not significantly degrade device performance, particularly since the lateral extent of junction 19 has been reduced to a much smaller extent due to the formation of barrier 25A, 25B and 25C, which damage regions of this injunction and make them electrically insulating so that they do not function to draw current.

Figure 4:
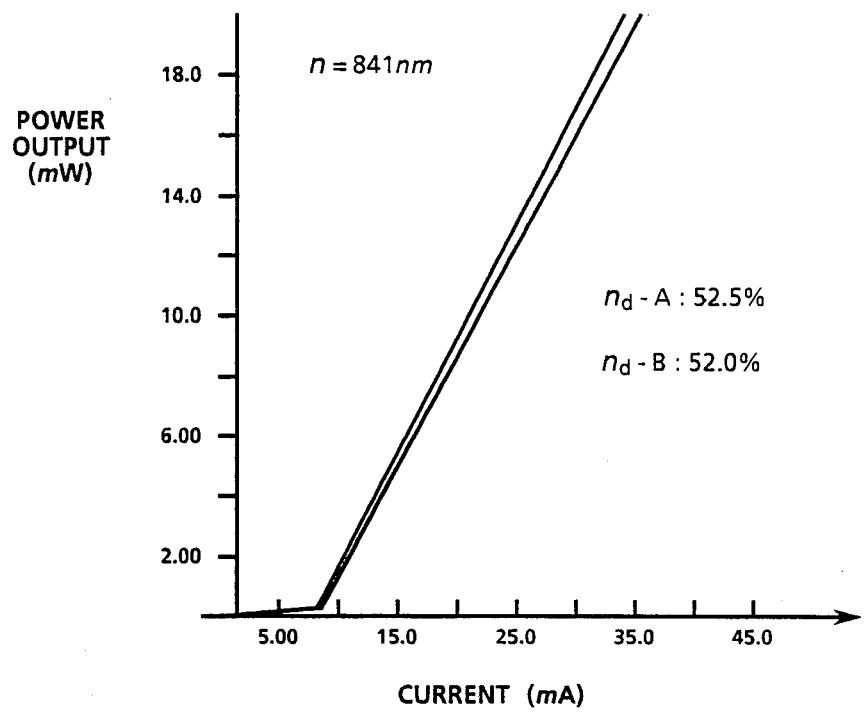
FIG. 4 is a graphic illustration of the optical power versus pumping current characteristics for a fabricated dual beam laser of the type shown in FIG. 1.
Figure 5:
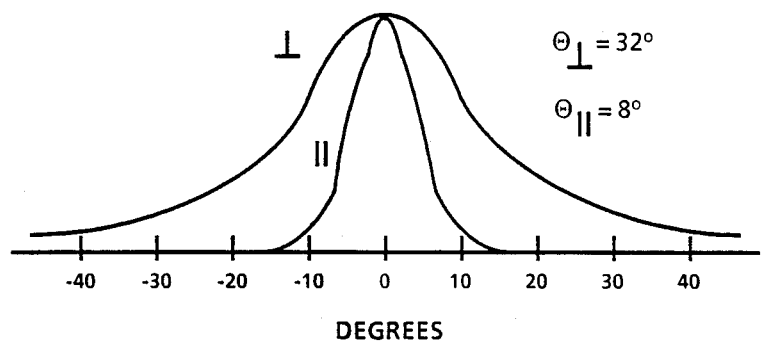
FIG. 5 is a far field pattern for a fabricated dual beam laser of the type shown in FIG. 1.
Figure 6:
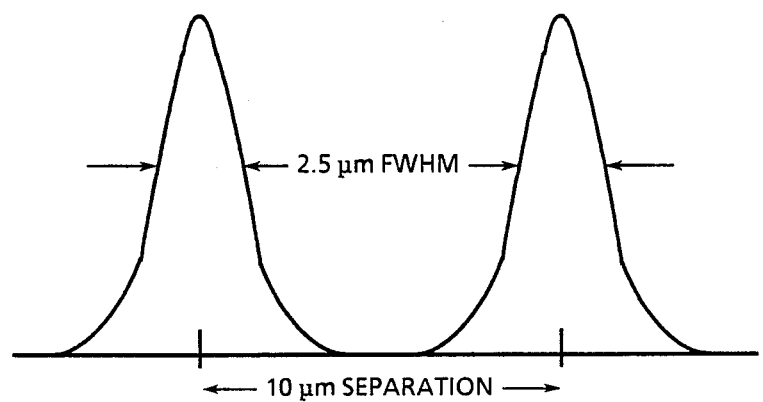
FIG. 6 is a near field pattern for a fabricated dual beam laser of the type shown in FIG. 1.

FIG. 4 discloses the optical output power versus pumping current characteristics for a fabricated dual beam laser 10 of FIG. 1 for elements 13A and 13B wherein cavity separation is approximately 10 μm. As shown, the output power for varying currents is practically the same but do differ slightly with an increase in pumping current. For example, at 15 mA, the output of element 13A is 5.2 mW and for element 13B is 4.8 mW. The output at 30 mW for element 13A is 10.8 mW and element 13B is 16.3 mW. FIGS. 5 and 6 illustrate respectively the far and near field emission patterns for this laser 10.

An important aspect of this invention is the elimination or reduction to acceptable levels crosstalk or interference in high speed modulation and CW oscillation in operation of a dual beam laser 10 that contains closely spaced emitters, i.e., in the range of 3-6 μm, in particular, in the range of 3-6 μm. For printing applications, it is necessary that modulation crosstalk not appear since any changes in light output of one laser element relative to modulation of the other, e.g. increase or decrease in light output of one laser element due to fall or rise in the modulation of the other laser element, will effect the quality and resolution of image formation on a printer photoreceptor surface. Also, oscillation crosstalk, i.e., the change in intensity, usually one of decrease in intensity, of one laser element due to the simultaneous CW oscillation of the other laser element, can be tolerated as long as the maximum light intensity decrease is small, such as 2% or less. There is a smaller tolerance value of light intensity variation in photoreceptor images produced by a 800 spi ROS printer. For laser printers, it is desirable that the difference of oscillation threshold current, $\Delta T_{th}$, between two such laser elements 13A and 13B be minimized because as the difference in threshold current increases, so does the light intensity decrease in one laser as the other oscillates CW.

Figure 3:
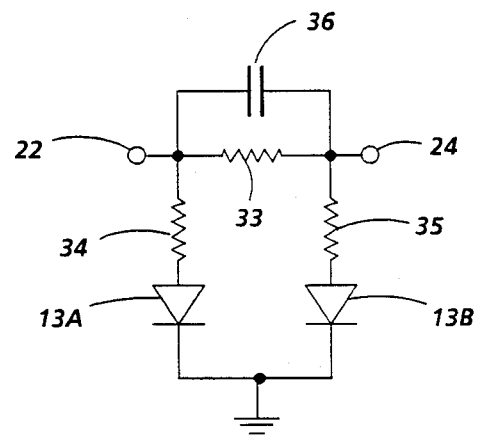
FIG. 3 is an equivalent circuit for the laser array shown in FIG. 1.

FIG. 3 illustrates the equivalent circuit for laser 10. Measurements of the coupling resistance 33 between laser elements 13A and 13B may fall, for example, between 15 to 19 MΩ. The coupling capacitance 36 for 1 MHz AC, for example, is about 0.1 to 0.5 pF. The series resistance 34 and 35 through each laser element 13A and 13B respectively is about 8 Ω. It is important to note that this series resistance determines the overall power conversion efficiency achievable. Since the light output power is linearly related to the input current above lasing threshold, whereas the resistive power loss, $P=I^2R$, is quadratically related to the input current to the laser element, the resistive losses will ultimately dominate over the light output power for sufficiently high input currents. Thus, series resistance is an important parameter when specifying device performance for low threshold laser devices. It is often the case that narrow lasing filaments employed to obtain low threshold currents results in excessively high series resistances which negate gains achieved in obtaining lower current threshold devices. The high power efficiency of 45% achieved for laser 10 is in large part due to the low series resistance of 8 Ω. The cross connection or coupling resistance of 15 MΩ is a result of the high resistivity of the proton implantation through cap layer 20 extending to a depth of about 500 nm in the region between emitters or elements 13A and 13B with a cross coupling capacitance of 0.5 pF.

Dual stripe lasers 10 fabricated by others with closely spaced emitters, e.g., with 10 μm center-to-center spacing or less that have lower values for cross resistance 33, reported as low as 1.4 Ω, will have excessive high speed modulation crosstalk, i.e., the forward voltage of one laser element will rise when the other laser element is turned on above threshold and, therefore, the laser element light intensity decreases and, further, increases in light intensity and falls in forward voltage when the other laser element is turned off. For this example, see the article of Y. Tokuda et al; "Dual Wavelength Emission From a Twin Stripe Single Quantum well Laser", Applied Physics Letters, Vol. 51(21), pp.1664–1666, Nov. 23, 1987. Thus, it is important that the coupling resistance be sufficiently high and the coupling capacitance be sufficiently low in order to adequately suppress modulation and CW oscillation crosstalk to a level acceptable for photoreceptor printing applications.

Regardless, spike like light intensity variation peak variations are always experienced in modulation of one laser element relative to the other. The tolerable value in such light intensity peak variations in standard photoreceptor image printing at 800 spi is about 4% of the light intensity sufficient to turn on two pixels at the electrostatic printing image. Laser 10 at a modulation at 5 MHz and a pumping current at 17 mA amounts to about 1.7% of the total turn on light intensity, which is quite satisfactory. It is clear, however, that the important factor is that the ratio between the cross connection impedance 33 and 36 relative to the series resistance 34 and 35 be sufficiently or significantly large to provide for negligible current flow via impedance 33 and 36, resulting in negligible affect in CW or pulsed operation of either lasing element due to the operation of the other lasing element.

Figure 10:
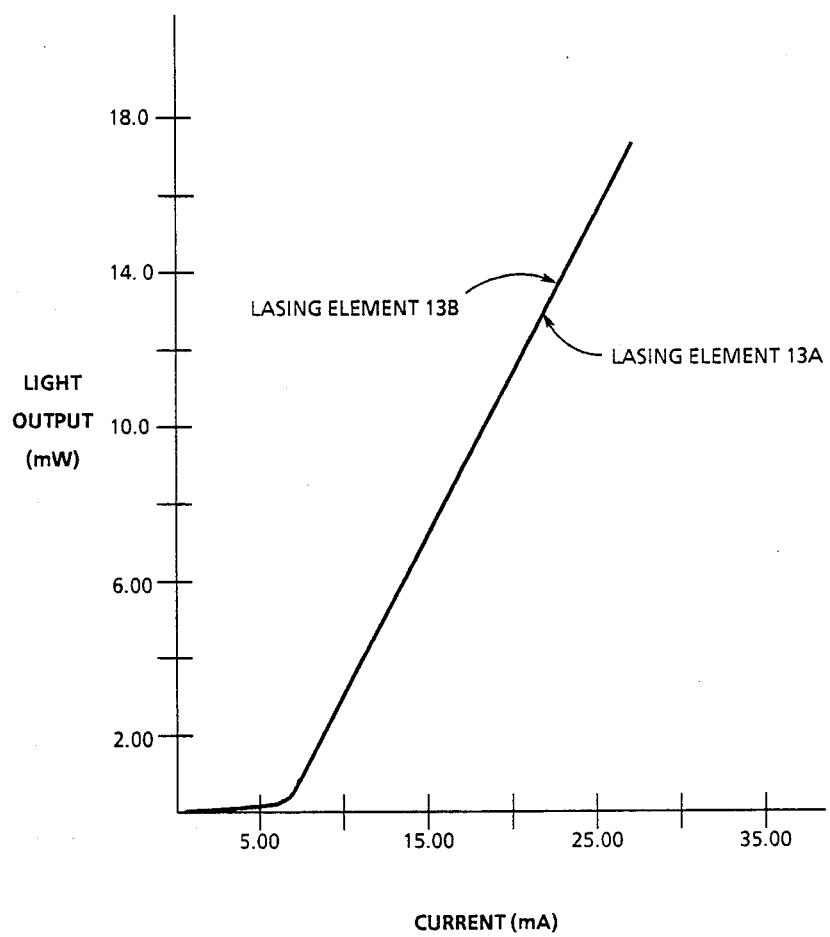
FIG. 10 is another graphic illustration of the optical power versus pumping current characteristics for independent CW operation of a dual beam laser of the type shown in FIG. 1 wherein the lasing elements have substantially identical power/current characteristics.
Figure 11:
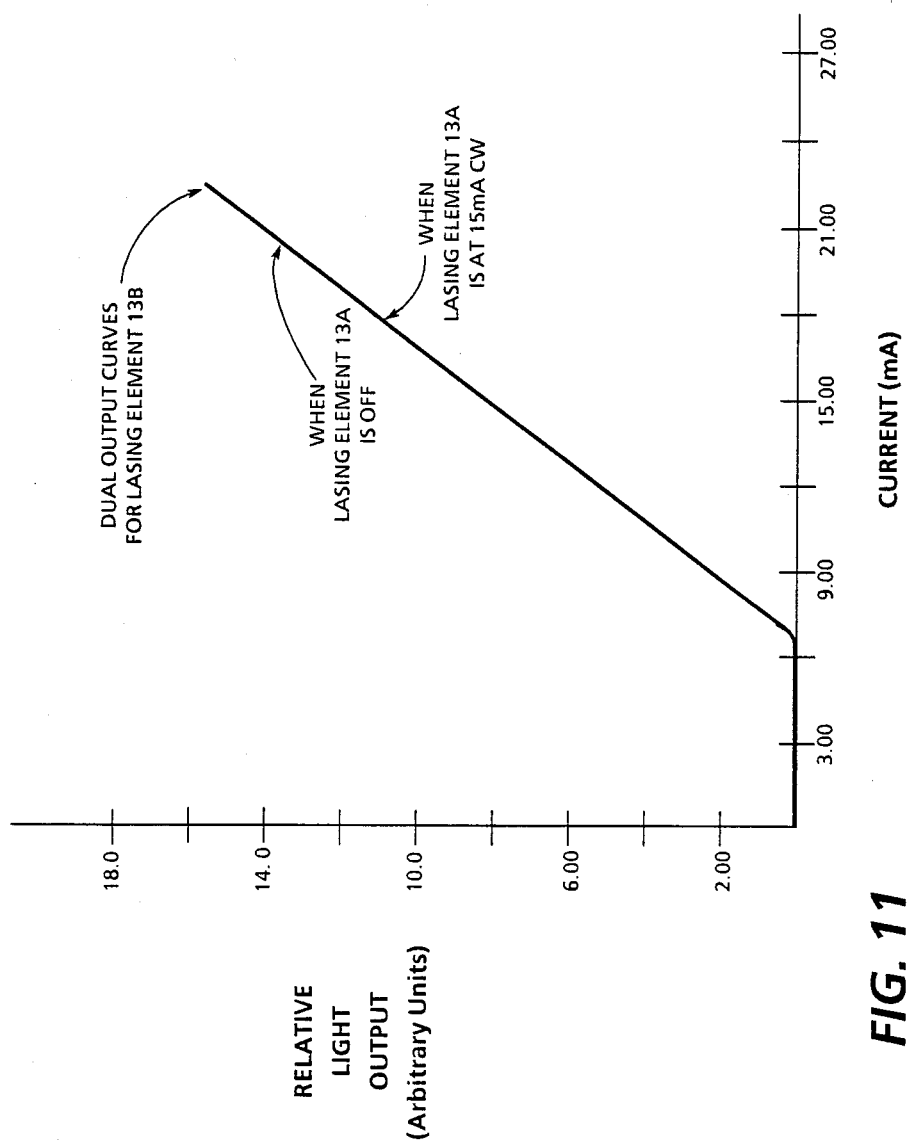
FIG. 11 is a graphic illustration of the optical power versus pumping current characteristics for both independent and dual operation of the a dual beam laser of the type shown in FIG. 1 wherein one lasing element is operated CW without substantial changes in its operating characteristics while the other lasing element is alternatively operated OFF and CW.

Another form of crosstalk that must be considered in the case of closely spaced independently addressable laser elements in a laser array is thermal crosstalk. Heat generated from the operation of one laser element will thermally diffuse to the other laser element and reduce its optical power output by increasing its temperature of operation. Such thermal crosstalk is difficult to compensate for because of its dependence on the instantaneous power of either laser element 13A and 13B on the power output of the other as previously operated for different periods of time. However, experiments have been conducted which indicate that thermal crosstalk between lasing elements 13A and 13B is not significant. In this connection, FIG. 10 illustrates the light output versus current characteristics for both lasing elements 13A and 13B operated independently and the resultant characteristic curves are substantially the same, i.e., they are superimposed. FIG. 11 illustrates the CW operation for lasing element 13B when the current to lasing element 13A is OFF or zero and also when the current to lasing element 13A is in CW operation above threshold, i.e., at 13 mA. To be noted is that the two output curves for lasing element 13B are substantially superimposed for the two conditions when lasing element 13A is OFF and CW. Such a negligible shift in the operating curves is indicative of minimal heating of laser element 13B due to close proximity of CW operation of laser element 13A. This low level of thermal crosstalk is directly attributable to low power operation and high efficiency of dual beam laser 10.

Figure 7:
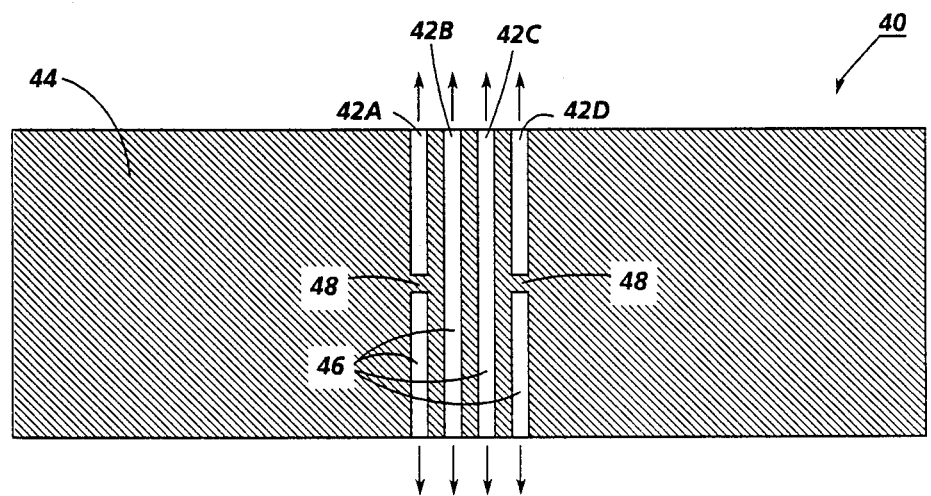
FIG. 7 is a plan view of another embodiment of a semiconductor laser array of this invention comprising four lasing elements illustrates the extent of a barrier implant performed on the laser array.
Figure 8:
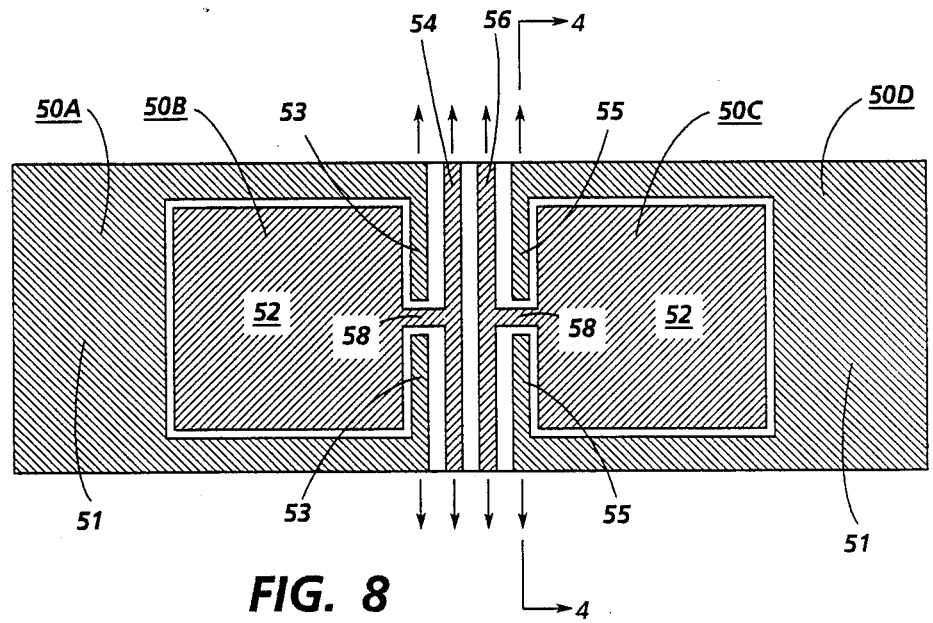
FIG. 8 is a plan view of the metal contact geometry for independently contacting and addressing the four lasing elements of the embodiment shown in FIG. 7.
Figure 9:
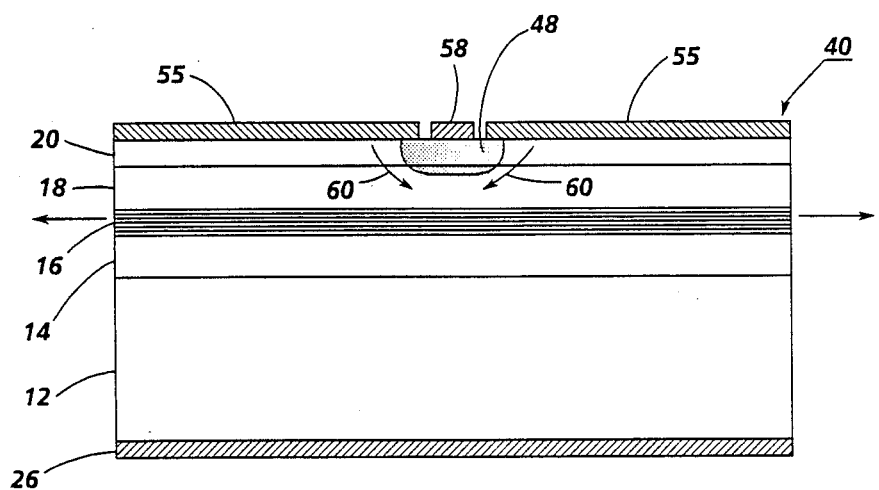
FIG. 9 is sectional view of the semiconductor laser array of FIGS. 7 and 8 taken along the line 9—9 in FIG. 7.

Of course, more than two closely spaced emitters in the range of 3–10 μm can be fabricated using the techniques of this invention. FIGS. 7–9 show features for such a multiple emitter laser array comprising four emitters. The problem confronted with several emitters is to how to independently contact to four emitters in order to be able to independently address four different laser emitters in close spatial relation without incurring undesired electrical and thermal interaction or crosstalk between the independently addressed lasing elements. The scheme illustrated in these figures solves that problem.

FIG. 7 illustrates a plan view of four beam laser 40 having the same cross sectional characterization as disclosed for laser 10 in FIG. 1, as indicated in FIG. 9, except laser 40 contains four lasing elements 42A, 42B, 42C and 42D rather than two such elements and may contain an active region comprising a single active layer or a single quantum well or a superlattice structure, e.g., alternating layers of GaAs and $Ga_{1-y}Al_yAs$ as illustrated in FIG. 9.

FIG. 6 depicts in halftone the pattern 44 comprising a shallow ion or proton implant for the purpose of electrically isolating each emitter from one another as well as forming a platform for fabricating four independent metal contacts, one for each laser emitter. This emitter electrical isolation is formed by implant regions 46 that extend through the parasitic junction region formed by the p-type (Zn) diffusion illustrated at 23 in FIG. 2. Further, implant crossover regions 48 of small width are formed across emitters 42A and 42D in order to make these regions highly resistive for the crossover contact connection of emitters 42B and 42C, as will be more evident below. The depth of implant pattern 44 may be, for example, about 300 nm.

After implant pattern 44 is accomplished, a metallization pattern is formed over pattern 44 in a configuration illustrated in FIG. 8. To be noted is that the metallization pattern, for example, a Cr—Au bilayer, comprises four contacts 50A, 50B, 50C and 50D for respective emitters 42A, 42B, 42C and 42D. Contact 50A and 50D have outer bonding pads 51 that connect to respective bifurcated stripes 53 and 55 for current pumping emitters 42A and 42D respectively. Contacts 50B and 50C have bonding pads 52 connected to contact stripes 54 and 56, respectively, via metal connection bridges 58. Contact stripes 53 and 55 are therefore bifurcated to accommodate the passage of implant crossover regions 48 and metal bridges 58.

The width of crossover regions 48, i.e., their width in the direction of emitters 42, should be fabricated to be as short as possible in order to permit lateral diffusion of carriers, indicated by arrows 60 in FIG. 9, during current pumping and carrier injection into active region 16 via bifurcated contact 55. If this width is sufficiently short, carrier diffusion beneath insulative crossover regions 48 will provide for substantially uniform pumping along the full cavity length of outside lasing elements 42A and 42D, i.e., including the portions of active region 16 beneath regions 48. However, as the width of region 48 becomes smaller, the series resistance through this bridge becomes larger commensurate with high pumping current values, such as in the range of 10–30 mA. Therefore, this region width should not be so small so as to increase the series resistance to an unacceptable level. An example of a crossover bridge within acceptable limits may be a depth of 0.3 μm with a transverse length across an outside laser element 42A or 42D of about 15 μm with a width of about 4 μm. The calculated series resistance would be approximately 0.3 Ω. In the case of a crossover region 48 with the same dimensions above except having a smaller width of 1 μm, the series resistance would be larger or about 1 Ω.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An independently addressable semiconductor laser array comprising a plurality of semiconductor layers with at least two lasing elements disposed in spatially separated optical cavities, said layers including an active region for light wave generation and propagation under lasing conditions, an impurity induced into regions laterally adjacent to and between said spatially separated optical cavities and penetrating through said active region therein causing at least a partial interdiffusion of elemental constituents of said active region and at least one adjacent semiconductor layer to produce disordered alloy regions, the depth of said disordered regions sufficient to optically isolate said lasing elements so as not to be in phase locked condition, barrier means formed between said lasing elements and extending into said array a sufficient distance to electrically isolate said lasing elements, means to independently pump said lasing elements, the combination of said disordered alloy regions and said barrier means providing for close proximity of said lasing elements with minimal electrical, optical and thermal crosstalk relative to the independent operation of said lasing elements wherein the center to center spacing of said lasing elements is in the range of 3–10 µm and the cross connection impedance between said lasing elements is sufficiently high to prevent detrimental thermal and optical crosstalk.

2. The independently addressable semiconductor laser array of claim 1 including means extending into said array to reduce the extent of the parasitic junction in said lasing elements, said extending means limited to the depth of said barrier means in said array.

3. The independently addressable semiconductor laser array of claim 1 wherein said independent pumping means comprises independently addressable electrical contact regions formed over and parallel each of said laser elements, crossover means formed transversely across the outer most positioned of said laser elements for electrical connection to intermediate of said laser elements positioned between said outer most laser elements, said outer most laser element contact regions being bifurcated at the point of said crossover means, the width of said crossover regions sufficiently short to permit lateral carrier diffusion therebeneath and uniform pumping along the length of said outer most laser elements but sufficiently large so as not to increase the series resistance of said outer most laser elements above unacceptable levels.

4. The independently addressable semiconductor laser array of claim 1 wherein said cross connection impedance between lasing elements is substantially higher than the series impedance of individual lasing elements so that an insignificant current flow occurs between said lasing elements during their independent or simultaneous CW or pumped operation.

* * * * *